United States Patent
Aleksov et al.

(10) Patent No.: US 9,520,378 B2
(45) Date of Patent: Dec. 13, 2016

(54) THERMAL MATCHED COMPOSITE DIE

(71) Applicants: Aleksandar Aleksov, Chandler, AZ (US); Shawna M. Liff, Gilbert, AZ (US)

(72) Inventors: Aleksandar Aleksov, Chandler, AZ (US); Shawna M. Liff, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 353 days.

(21) Appl. No.: 13/725,356

(22) Filed: Dec. 21, 2012

(65) Prior Publication Data

US 2014/0177158 A1   Jun. 26, 2014

(51) Int. Cl.
  *H01L 23/00* (2006.01)
  *G06F 1/18* (2006.01)
  *G06F 1/20* (2006.01)

(52) U.S. Cl.
  CPC .......... *H01L 24/80* (2013.01); *G06F 1/20* (2013.01); *H01L 24/01* (2013.01); *H01L 24/32* (2013.01); *G06F 2200/201* (2013.01); *H01L 2224/16225* (2013.01); *H01L 2224/73253* (2013.01); *H01L 2224/83201* (2013.01); *H01L 2924/10253* (2013.01); *H01L 2924/15311* (2013.01); *H01L 2924/16195* (2013.01); *H01L 2924/171* (2013.01); *H01L 2924/351* (2013.01)

(58) Field of Classification Search
  CPC ............ H01L 23/373; H01L 23/49513; H01L 29/7848; H01L 21/76251; H01L 24/01; H01L 24/73; H01L 24/80; H01L 2224/01; H01L 2224/06505; H01L 2224/06515

USPC .......................................... 257/751; 438/455
See application file for complete search history.

(56) References Cited

U.S. PATENT DOCUMENTS

| | | | | |
|---|---|---|---|---|
| 6,175,084 | B1 * | 1/2001 | Saitoh ................... | H01L 23/142 174/250 |
| 6,586,268 | B1 * | 7/2003 | Kopola ................ | H01G 9/2027 438/22 |
| 7,744,991 | B2 * | 6/2010 | Fischer ..................... | B32B 5/18 428/317.3 |
| 2001/0048157 | A1 * | 12/2001 | Murtuza ............. | H01L 23/3114 257/734 |
| 2003/0087463 | A1 * | 5/2003 | Horng ................... | H01L 33/405 438/29 |
| 2003/0113979 | A1 * | 6/2003 | Bieck ................ | H01L 21/76898 438/411 |
| 2003/0203668 | A1 * | 10/2003 | Cobbley .................... | C09J 5/00 439/323 |
| 2010/0213403 | A1 * | 8/2010 | Hasegawa ............ | C09J 153/025 252/74 |
| 2011/0274888 | A1 * | 11/2011 | Tang ...................... | B82Y 30/00 428/189 |
| 2012/0218352 | A1 * | 8/2012 | Fujii et al. ....................... | 347/47 |

(Continued)

*Primary Examiner* — Jerome Jackson, Jr.
*Assistant Examiner* — David Spalla
(74) *Attorney, Agent, or Firm* — Blakely, Sokoloff, Taylor & Zafman LLP (57) ABSTRACT

A thermal matched composite material, suitable for use as a die is described. In one example, the material includes a metal plate and a substrate having a coefficient of thermal expansion (CTE) lower than the metal plate to carry microelectronic circuits. An adhesive layer between the substrate and the metal plate physically attaches the metal plate to the substrate so that the combined metal plate and substrate have a higher CTE than the substrate alone.

20 Claims, 6 Drawing Sheets

(56) References Cited

U.S. PATENT DOCUMENTS

2013/0058067 A1\* 3/2013 Yee .................. H01L 23/36
361/820

\* cited by examiner

THERMAL MATCHED COMPOSITE DIE

FIELD

The present disclosure relates to the field of semiconductor substrates and in particular to a metal silicon composite substrate.

BACKGROUND

Silicon substrates suffer from two problems that make it more difficult to process, package, and operate semiconductor die packages. The first is expanding when heated at a rate that is different from the rate of expansion of other related parts such as package substrates. The second is warping when heated. This occurs to silicon substrates that have metal upper layers because the silicon expands at a different rate from the metal. These problems occur for standard flip-chip packaging, embedded dies within substrate technologies, and other types of semiconductor substrates.

Results of these thermal effects include assembly stress on both solder joints and ILDs (Inter-Layer Dielectric) leading to failure when a silicon substrate is attached to a package substrate. FLI (First Level Interconnect) solder joint and ILD reliability can be affected. During reliability stress testing and product use, the temperature of a die may change from as low as −55° C. to as high as 125° C. The thermal expansion of the die relative to the package substrate stresses the solder joints and the ILD which may lead to product failure. FLI and SLI (Second Level Interconnect) SJR (Solder Joint Reliability) are both affected for standard flip-chip packaging.

Die warpage affects embedding, solder reflow, and thermal compression bonding. Because the Silicon has numerous layers of copper built up on one side, the CTE (Coefficient of Thermal Expansion) difference between the silicon and copper creates a bending moment which leads to die warpage. Consequently, standard PnP (Pick and Place) and solder reflow processes can be impacted by non-connect opens, solder bridging and misalignment. This impact is increased as the solder bump pitch shrinks, as the chip area increases, and when both happen in combination because in some areas the substrate solder does not contact or wet the chip bump. Furthermore, the warpage of the die requires a chip holder to exert a strong vacuum on the chip to ensure the die is held flat. Once the chip is released, die warpage can influence solder joints particularly if the chip is released prior to solder solidification. Furthermore, strong adhesives are needed to hold a die flat on an embedding panel once placed to prevent the die from curling up. Often non-conductive, epoxies are used which then either limit the thermal conduction through the die back-side or require etching in order to enable a thermal conduction solution.

Embedded die and package stress caused by warpage and CTE mismatch can also cause failures. The CTE mismatch between the silicon and package build up layers, typically made of copper and dielectric, leads to thermal stresses on the ILD and the vias in the die. This is exacerbated during temperature cycling and can lead to via pump out and ILD cracking.

CTE mismatches are not limited to substrates based on silicon and silicon dioxide. Similar problems occur with other types of substrates such as inorganic, ceramic, glass, silicon-on-insulator (SOI), germanium, III-IV attached to organic and organic/inorganic composite substrates.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

A bilayer metal, substrate composite can be formed to resist warpage and CTE mismatch between a silicon substrate and other materials. The resultant composite is thermally conductive and better CTE matched to the build-up layers into which the die is embedded or the package onto which the die may be bonded.

In one embodiment, a thinned silicon die or wafer is attached on the backside to a thicker metal plate. The metal plate may the same size or a little larger than the wafer or the die. The attachment forms a mechanical bi-layer composite material. In one embodiment, the bilayer composite is a copper, silicon composite that helps embedded package ball attach yield and joint SLI (Second Level Interconnect) reliability and, in turn, allows the embedded package and die size to grow and encompass more products.

The metal plate may be selected to have a high thermal conductivity metal with a CTE (Coefficient of Thermal Expansion) similar to that of a composite package onto which it may be bonded or into which it may be embedded. One such metal is copper (Cu). Cu is already commonly used in semiconductor manufacturing and may be easier to use in current manufacturing processes compared to alternative metals. In the case of Cu a barrier metal layer on the metal plate may be used to inhibit Cu diffusion into the silicon (Si) forming the semiconductor substrate. The diffusion barrier may be formed of TaN, Ni, W, or other materials. The diffusion barrier may have a thickness of about 10 nm. Depending on the particular application the diffusion barrier may have a thickness of from 5 nm to 100 nm. Depending on the application and the CTE of the corresponding composite package, any appropriate metal may be selected. For semiconductor applications where the semiconductor substrate is attached to or embedded within current organic packages, typically the selected metal will have a CTE, a Young's modulus (E), and a thermal conductivity similar to or greater than Cu.

The thickness of the metal plate may be about 2-10 times that of the Si substrate depending on the targeted mechanical properties and potential stress that any transistors on the semiconductor substrate can accommodate. In one example a Cu plate is 4 times thicker than the substrate. By providing a very high degree of thermo-mechanical coupling between the silicon and the metal, die expansion and warpage are reduced.

For a typical microelectronic circuit die, good results may be obtained by forming a Si/Metal composite in which the surface of the silicon on the FLI (First Layer Interconnect) side has a CTE of 10 ppm/° C. or above. As described herein this may be done without added equipment complexity and without the deposition of thin metal layers on the thin Si backside. The attachment process may be done at temperatures below 250° C. and even below 100° C. Any elevated temperature and particularly above about 250° C. may shift device performance. The entire thickness of the composite may be maintained at a thickness that is no more than that of a typical 12" wafer (e.g. 775 µm). Thinner stacks are also possible.

Figure 1:
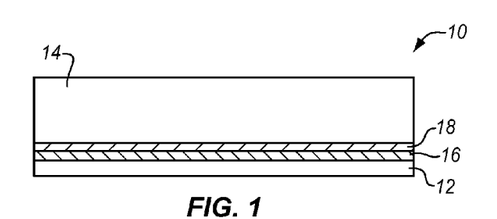
FIG. 1 is a cross-sectional diagram of substrate/metal bilayer composite material according to an embodiment of the invention.

FIG. 1 is a cross-sectional diagram that shows an example of a Si/Cu composite material 10 as described herein. A silicon substrate 12 which may or may not be thinned is attached to a metal plate 14 such as Cu using an adhesive layer 16. Depending on the adhesive and the type of metal, a diffusion barrier 18 may be placed between the metal plate and the silicon substrate. The diffusion barrier may be applied between the metal plate and the adhesive as shown or between the adhesive and the silicon substrate, depending on the particular materials used.

Figure 2:
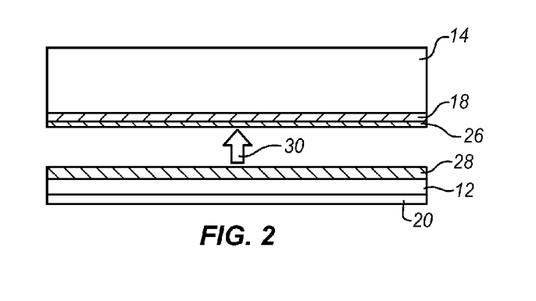
FIG. 2 is a cross-sectional diagram of bonding a substrate to a metal plate according to an embodiment of the invention.

FIG. 2 is a cross-sectional diagram that shows the materials before the metal plate 14 and the substrate 12 are joined. A copper diffusion barrier layer 18 and metal preferential adhesive layer 26 are applied to the metal plate. Similarly a silicon preferential adhesive layer 28 is applied to the silicon substrate 12. The attachment surface of the silicon may be silicon or it may be a native oxide of the silicon, such as $SiO_2$. The silicon substrate is shown with backend interconnect layers 20 formed on the backside of the substrate opposite the adhesive layer. With the adhesive applied, the two layers are pressed together as indicated by the arrow 30. This results in the structure of FIG. 1 or a similar structure. The two adhesive layers may migrate together to form a single layer as shown in FIG. 1, depending on the particular adhesives that are used.

A variety of different materials may be used to provide the desired thermo-mechanical coupling of the metal plate with the silicon to form the described bilayer composite. The coupling agent may be initially deposited or applied on one side of the interface, the other side of the interface, or it can be applied on both sides. It can be a single material, a pair, or a stack of materials.

FIG. 2 may be summarized as applying a first adhesive silicon preferential layer to the silicon substrate, applying a second adhesive metal preferential layer to a metal plate, and then pressing the first adhesive layer to the second adhesive layer to attach the silicon substrate to the metal plate. The adhesive layers may be applied in one operation as shown or as two parts.

Figure 3A:
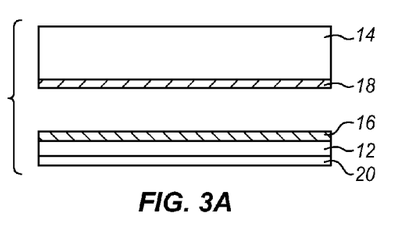
FIG. 3A is a cross-sectional diagram of a substrate and a metal plate with adhesive applied according to an embodiment of the invention.
Figure 3B:
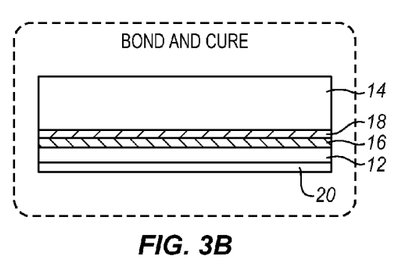
FIG. 3B is a cross-sectional diagram of bonding the materials of FIG. 3A according to an embodiment of the invention.

In one embodiment an organic coupling material or inorganic/organic hybrid layer (e.g. sol-gel) or set of materials, such as adhesives may be used to tightly mechanically couple the Si and the metal plate. FIG. 3A is a cross-sectional diagram of forming a bilayer composite material. FIG. 3B is a cross-sectional diagram of the bilayer composite material formed as shown in FIG. 3A. A single coupling or adhesive material 16 is deposited on one side of one of the materials, either the metal 14 or the substrate 12. In this case it is applied to the Si on the side opposite the back end layers 20. The coupling material may be deposited by spin coating, slit coating, spray coating, among other techniques. Post deposition a thermal process, such as a pre-bake may be needed to remove solvent from the coated material. A diffusion barrier layer 18 may also be applied to the metal layer.

After deposition and any treatment operations, such as solvent removal, if necessary, the parts may be bonded together using a certain pressure and, if necessary, an elevated temperature as indicated in FIG. 3B. Furthermore, depending on the adhesive formulation, further heat treatment may be needed to cure the formulation. This may be accomplished under elevated temperature, and, if needed, under pressure to ensure a strong bonding or coupling. For a typical silicon semiconductor structure the heat may be kept below about 220° C. to minimize stress on transistors and other components. For a suitable thermo-setting composite resin system as described herein any of a wide range of different cure temperatures and times may be used to suit manufacturing constraints and the composition of the resin. The temperatures and pressures may be adapted to suit any particular adhesive or combination of adhesives. Lower temperatures minimize the stress on the transistors or upper layers of the silicon substrate. Using the materials described herein, the temperature to bond and cure the adhesive may be kept well below the melting point of any metal layers that are or may be formed on the substrate. The temperature may also be kept well below any downstream assembly processes such as solder reflow temperatures at FLI or SLI (about 260° C. depending on the choice of solder) or in the case of die embedding the dielectric cure temperature (about 180° C.), among other processes.

Figure 4A:
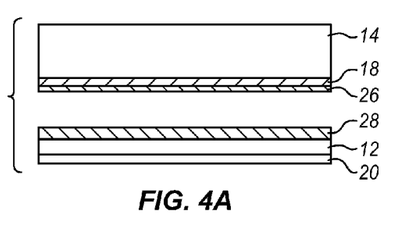
FIG. 4A is a cross-sectional diagram of a substrate and a metal plate with adhesive applied according to another embodiment of the invention.
Figure 4B:
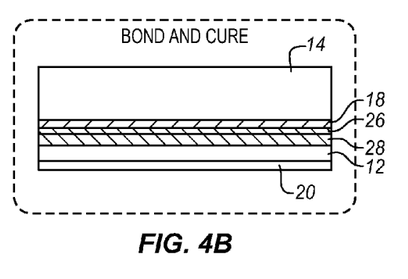
FIG. 4B is a cross-sectional diagram of bonding the materials of FIG. 4A according to an embodiment of the invention.

FIG. 4A is a cross-sectional diagram of an alternative process for bonding or coupling layers together. The metal plate has a metal diffusion barrier layer 18 applied and an adhesive layer 26 such as a metal preferential layer. The substrate 12 indicated as having back end connections 20 has a silicon preferential adhesive layer 28 applied opposite the back end connections. As shown two separate materials may be dispensed one on either coupling surface prior to bonding. The material 26 dispensed on the metal 14 may be chosen such that it creates a very strong bond to the metal, while the other side of the material 26 may be chosen such that it bonds particularly well to the free end of the material 28 deposited onto the Si 20 as shown in FIG. 4B. Meanwhile that material 28 dispensed on the Si itself 20 creates very strong bonds with the Si or the native oxide, e.g. SiO2. Accordingly separate surface treatments are used for the two layers.

Figure 5A:
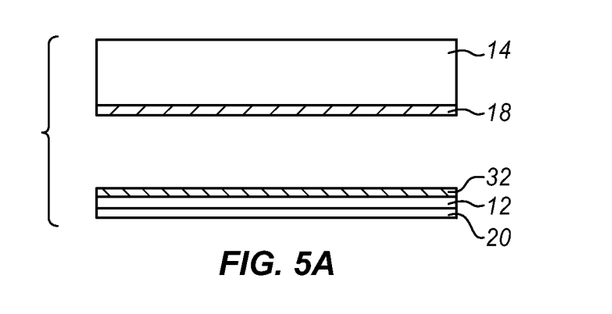
FIGS. 5A to 5D are cross-sectional diagrams of forming a substrate/metal bilayer composite material according to an embodiment of the invention.
Figure 5B:
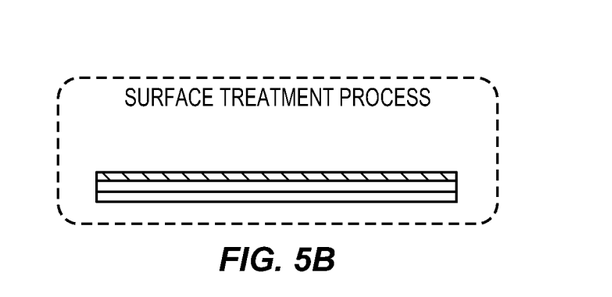

Prior to applying the actual coupling agents or adhesive materials 26, 28 a surface pretreatment may be used on either one or both sides of the system. FIG. 5A is a cross-sectional diagram of a metal plate 14 with a diffusion layer 18 to be joined to a substrate 12. An adhesive layer 32 is applied to the substrate opposite a back end 20. In FIG. 5B a pretreatment is applied to the silicon. The single side chosen was the Si side of the composite, but it could be the metal.

The material deposition location on any single side deposition can be reversed. For example, instead of depositing a material on the Si as shown it may be possible or beneficial to deposit the material on the metal. The choice of sides may depend on material compatibility, deposition methods and cost assumptions.

Figure 5C:
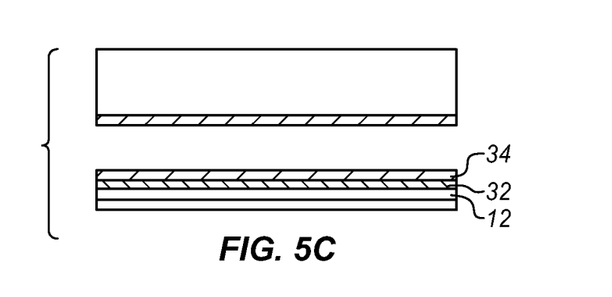
Figure 5D:
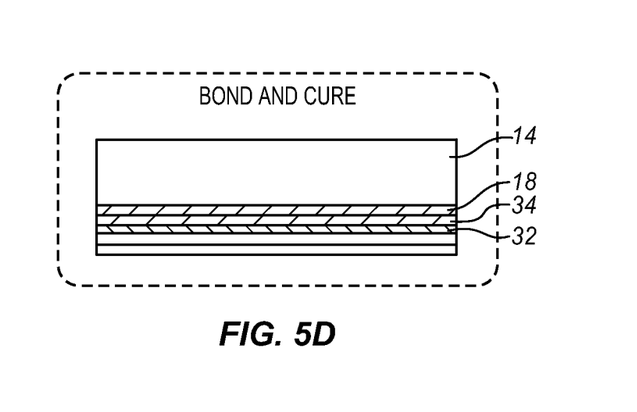

After the surface treatment process of FIG. 5B, a coupling material 34 is applied over the finished surface treatment 32 as shown in the cross-sectional diagram of FIG. 5C. After the materials are applied, then the two plates, the substrate and the metal are brought together, with heat and pressure in some cases, as shown in the cross-sectional diagram of FIG. 5D. FIG. 5D shows that the newly formed bilayer material is bonded and cured.

Figure 6A:
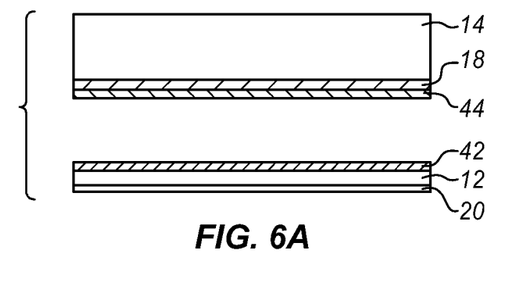
FIGS. 6A to 6D are cross-sectional diagrams of forming a substrate/metal bilayer composite material according to another embodiment of the invention.

FIG. 6A is a cross-sectional diagram of forming a bilayer composite using a surface treatment 42 on the front end of a substrate 12 and a surface treatment 44 on a metal plate. As described previously, the metal plate 14 has metal diffusion barrier 18 applied before the surface treatment. However, the diffusion barrier may be performed in different locations and at different times in the process.

Figure 6B:
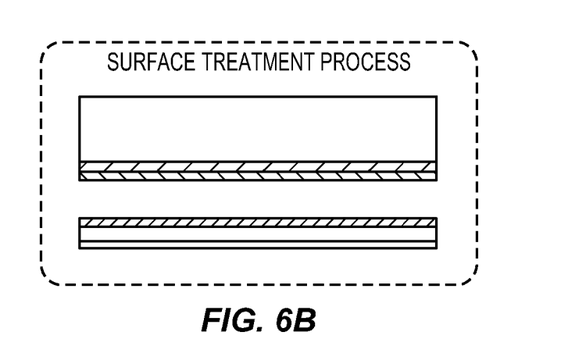
Figure 6C:
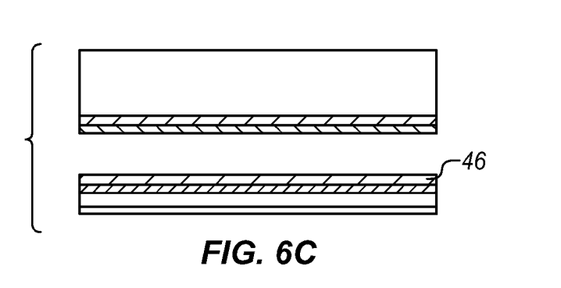
Figure 6D:
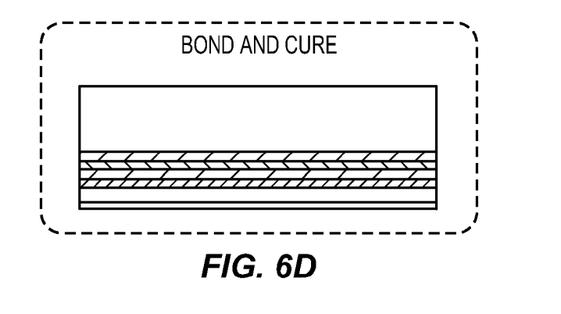

The surface treatment is pre-treated in the cross-sectional diagram of FIG. 6B, for example by heat or other curing processes. A coupling material 46 is applied to one or both surface treatments as shown in FIG. 6C. The same or different coupling materials may be applied to the two sides, that is to the metal 14 and the silicon substrate 12. In the cross-sectional diagram of FIG. 6D, the metal and substrate are brought together and then bonded and cured to form a bilayer composite material.

Different processing options may be applied as shown using, for example, an organic coupling and adhesive material. As shown, the metal and silicon may be coupled with no surface treatment using a one-sided deposition or one-sided deposition in two subsequent deposition steps. Alternatively, a dual sided deposition may be used. A single-sided surface treatment may be used with a single-sided adhesive deposition. A dual-sided surface pretreatment may be used with a single-sided adhesive deposition. The deposition methods include, but are not limited to spray-coating, spin coating, slit coating, lamination, and dip-coating, among others.

A variety of different adhesive materials may be used on one or both bonding surfaces. One such example for the silicon described in this embodiment includes a zirconium alkoxide together with an epoxy functionalized silane to form a sol-gel layer. These two materials may be used to form a gradated hybrid layer on the native silicon oxide with the Zr preferentially buried at the oxide surface and with epoxide functionality dangling away from the interface. A composition ratio of 0.7 Zr to Si provides good adhesion and resists moisture assisted de-bonding, a common weakness of traditional epoxy-silicon interfaces. This sol-gel formulation can be spray coated, dip coated, slit coated, or printed atop the silicon and the condensation reaction can be completed at a temperature of 120° C.

On the metal surface, any of a number of different adhesives may be applied to covalently bond with the adhesive on the silicon surface. One such example is a terpene phenolic copolymer or resin that includes amine or similar activity that can react and cross-link with the epoxide groups of the sol-gel hybrid layer. A terpene phenolic resin provides excellent adhesion to metallic surfaces, is environmentally friendly, and is often used as a tackifier in thermoplastic adhesives or rubbers. In addition terpene phenolic resins do not complex with metal oxides and have tunable matrix compatibility or solubility and glass transition temperatures, making this type of adhesive attractive for this application. Similar epoxy cross-linking chemistry may be used. Some examples of epoxy cross-link materials that may be used to form adhesives as alternatives to amines include carboxyl acid, anhydride acid, and isocyanates. In order to enhance thermal conduction, the adhesive layers may also be filled with thermally conductive particles, such as silver, graphite, boron nitride, aluminum nitride, alumina, copper, indium, and diamond, among others. These particles may be selected in a small enough size to allow the bond line to be sufficiently thin. Other material systems may be used, depending on the intended results and applications for the bilayer composite.

Figure 7:
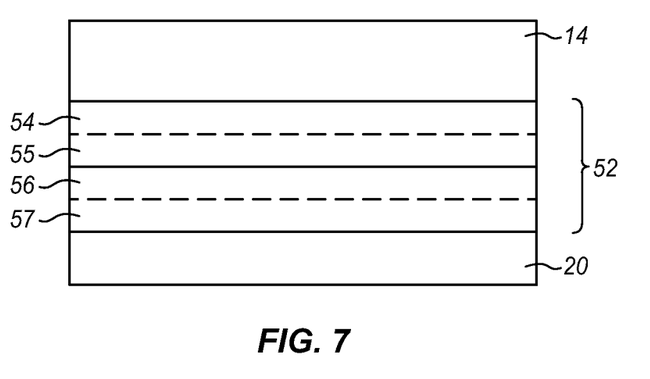
FIG. 7 is a cross-sectional diagram of a substrate/metal bilayer composite material having gradations in a bonding adhesive according to an embodiment of the invention.

FIG. 7 is a cross-sectional diagram of a formed bilayer composite material showing the metal plate 14 which may include a diffusion barrier (not shown) joined to a silicon substrate 20 using an adhesive 52. The adhesive may be homogeneous, layered or gradated through the thickness. The layer deposited on the metal plate may take many different forms. It may be a homogeneous epoxy matrix. It may be a homogenous blend or block copolymer. It may be a blend or block-copolymer resin that preferentially arranges itself based on kinetics and thermodynamics, such as surface energy interactions, so that the adhesive surface on the coated substrate is optimized and the adhesive surface at the air interface will adhere well to the silicon substrate itself or will covalently crosslink with the adhesive applied on the silicon. This preferential phase separation may be tuned via adhesive composition, deposition technique, or via thermal exposure upon bonding or curing. In the example provided utilizing a terpene phenolic copolymer with amine functionality, ideally the terpenes would migrate toward the metal plate and the amine functionality toward the air interface. Upon bonding the adhesive could easily crosslink with the epoxides on the alternate face.

This phase-separation or gradated structure is exaggerated in FIG. 7 where two sub-layers are shown, 54 and 55, in which the terpene rich region has migrated toward the metal 54. This forms a metal preferential sub-layer 54 with a higher concentration of terpene phenols. A bonding sub-layer 55 is left that has a higher concentration of the amines or similar cross-linkable material to covalently link with the epoxy or resin on the opposite interface.

The layer deposited on the silicon has similarly been shown to migrate into two sub-layers where the silicon preferential adhesive has a sub-layer proximate the silicon substrate. In the sol-gel example provided this would be the region with a higher concentration of zirconia 57. The remaining portion of the adhesive, the epoxy rich region, can be shown in the diagram to form a bonding sub-layer 56. While these sublayers could be optimized to become distinct bi-layers, in other embodiments, the layers are more likely to form gradated structures that are nearly indistinguishable from a homogeneous layer. The two sub-layers 55 and 56 are designed to bond together to hold the metal and silicon layers together.

In the illustrated example this could be where epoxides are linked to the alternate resin via amine functionality, but any of a number of cross-link schemes could be utilized to link these layers by those skilled in the art. In the specified example, the adhesive layer has gradations of terpene phenols proximate and adhered to the metal plate, amines proximate and adhered to the terpene phenols, epoxy proximate and adhered to the amines, and zirconia proximate and adhered to the silicon substrate. Using different bonding layers different material gradations may be formed.

The sub-layers may be formed before the metal and substrate are pressed together. Furthermore, the migration into sub-layers may be encouraged using heat and other preliminary treatments e.g. a thermal anneal prior to bonding or solvent anneal. In some embodiments, the adhesive layers form a thermo-setting composite resin system that self-assembles or preferentially segregates after application, or during thermal treatment while annealed, bonded, and/or cured. In the case of a bilayer pre-preg or laminate that is prepared with directionality i.e. selective adhesive properties on either side prior to application, the adhesive may be applied directionally with one part of the system applied toward the metal and the other part applied toward the silicon substrate or bonding interface.

Stress coupling and thermal coupling may be improved if the bond lines are held thin. However, the bond lines must be thick enough to compensate for the roughness of the metal material and the silicon substrate. A polished Si backside may have peak to valley roughness less than 1 μm. A well polished metal plate may have a peak to valley roughness of about 2 μm. Accordingly, the total bond thickness may be made as low as 2 μm. With better polishing, even thinner bond lines may be obtained. Of course thicker bond lines may be used e.g. 10-20 μm, or 20-50 μm, but the impact on thermal conductivity and stress coupling must be accounted for.

The described bilayer composite material provides a significant reduction of assembly stress, mitigating the risk for ILD and solder joint failures. There are benefits in chip attach and Integrated Heat Spreader attach operations, because the two components being joined should have more similar effective CTEs. The temperature gradients experienced by a silicon substrate may be from ambient to 220° C. or more during assembly. Reducing the warpage and CTE mismatch between two items joined via solder through this temperature range reduces the strain on the solder joints during cool down and improves reliability. For embedded die technology the reduced warpage improves die placement accuracy and has improved SLI ball attach yield while reducing SLI attach stress. This may allow for larger die form factors to be embedded or assembled and provide a means for increased computational power and functionality.

Figure 8:
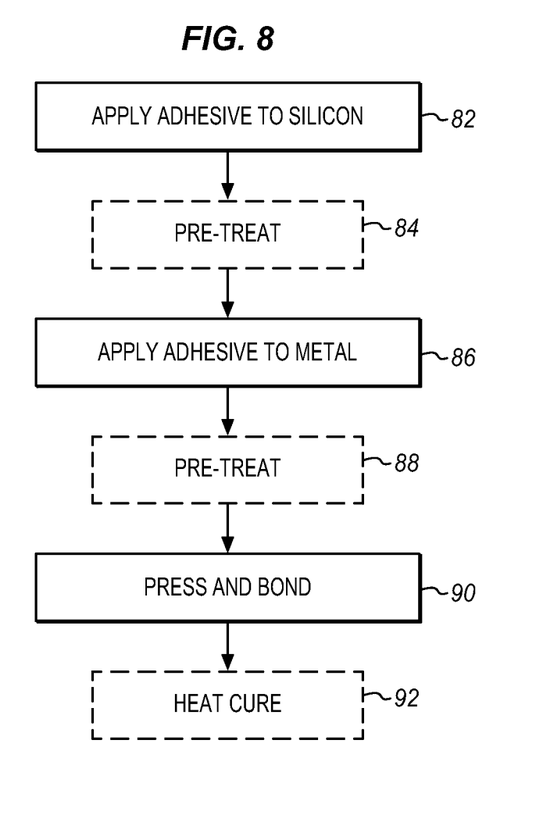
FIG. 8 is a process flow diagram of forming a substrate/metal bilayer composite material according to an embodiment of the invention.

FIG. 8 is a simplified process flow diagram for effectively increasing the CTE of the silicon substrate, protecting a die against warpage, mitigating assembly stresses and improving ILD and solder joint reliability according to one embodiment. At 82 a device, such as but not necessarily a semiconductor wafer, is formed. The device may have a thinned substrate, depending on the particular implementation. An adhesive is applied as described above. This adhesive may have an affinity or preference for silicon or silicon dioxide, such as a zirconia-epoxy sol-gel. The bonding layer is formed on the backside of the device. At 84 the silicon adhesive layer is optionally pre-treated by heating or in some other way. At 86 an adhesive layer is applied to the metal plate. This adhesive may similarly have an affinity or preference for the metal, such as terpene phenol filled epoxy resin. This adhesive may also optionally be pre-treated. In either case the pre-treatment may be to encourage the adhesive to move to the stratification or gradiation shown, for example, in FIG. 7.

While the surfaces with applied adhesive may be pre-treated, surface finishes may also be applied to either the silicon substrate or the metal plate before the adhesive is applied. Surface polishing, for example, may allow for a thinner bond layer. With the surfaces and adhesives prepared they are bonded together at 90, typically with heat and pressure. The specific technique for bonding will depend on the particular adhesives that are applied. At 92, the materials may optionally be heat cured, depending on the particular adhesives that are used. The completed device may be a wafer ready for further processing or fabrication, e.g. by photolithography. Alternatively, the device may be a completed die prior to packaging.

Figure 9A:
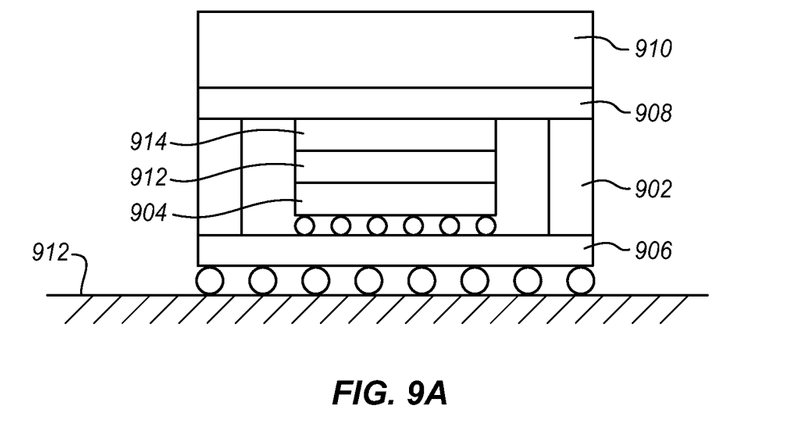
FIG. 9A is a cross-sectional diagram of a packaged die wherein the die includes a substrate/metal bilayer composite material according to an embodiment of the invention.

FIG. 9 is a cross-sectional diagram of a package having a package substrate and a die with a thinned backside substrate and applied metal plate according to one embodiment. The die 904 includes an adhered metal plate 912 as described above to prevent warpage and provide other benefits when the die is attached to a package substrate 906 under high temperature. The die may be attached using solder balls as shown or in any of a variety of other ways. The die is sealed against the external environment with sealant sidewalls 902 that surround the die and typically are plastic or ceramic. A cover 908 attaches to the top of the sealant, in this case in the form of an integrated heat spreader. The cover is attached to the metal side 912 of the die using a thermal interface material 914 such as a polymer or a metal that serves to adhere the die to the integrated heat spreader.

A cooling system 910 is then typically attached to the heat spreader to cool the die when in use. The cooling system, in some cases a heat sink 910, is attached to the package. The cooling system may be heat fins, fans, heat pipes, a cooling fluid system or any other suitable cooling system depending on the particular application for the die and package.

Figure 9B:
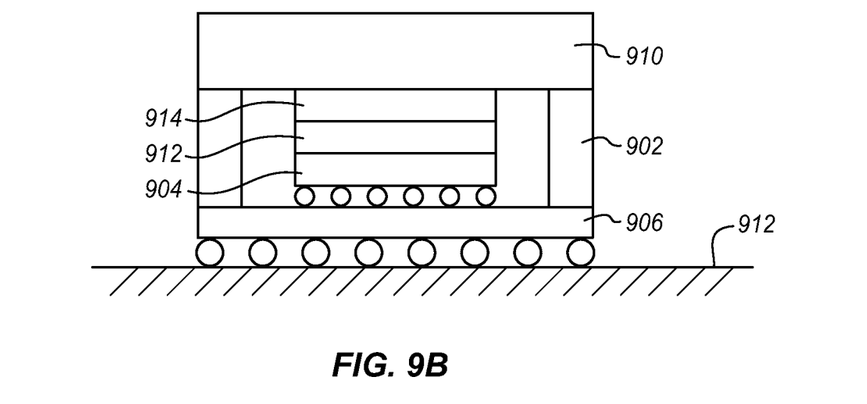
FIG. 9B is a cross-sectional diagram of a packaged die wherein the die includes a substrate/metal bilayer composite material according to another embodiment of the invention.

The integrated heat spreader may be omitted because the metal plate on the back side of the die also has some heat spreading capability. This is shown in FIG. 9B. The structure is the same as in FIG. 9A, however, the heat spreader 908 has been omitted. The cooling system 910 is attached directly to the metal plate 912 of the die using a thermal interface material 914. The thermal interface material may be a polymer or metal or a conventional thermal grease, depending on the particular implementation. In both illustrated examples, the cover may be held by the thermal interface material or by the sealant 902 or both.

Figure 10:
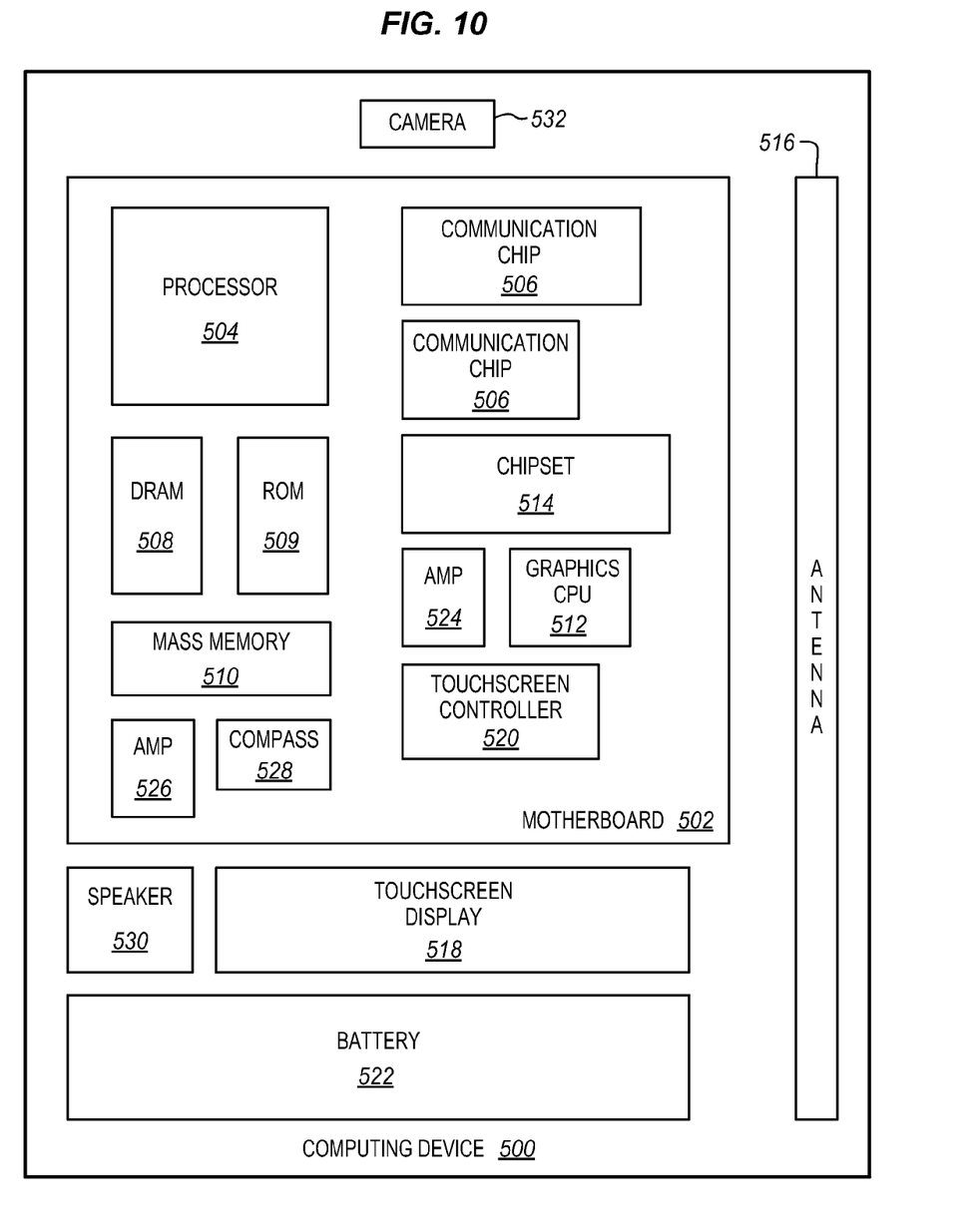
FIG. 10 illustrates a computing device 500 in accordance with an embodiment of the invention.

Packaged between the substrate and the cover, the die may be attached through the substrate to a printed circuit board 912 of a device such as that of FIG. 10 for any of a variety of different uses. The board connects the packaged die to other components for power, input, output, and other interconnections. The package may also have other connections for test or use separate from the board. The substrate translates the solder ball connection points of the die to the solder ball connection points of the printed circuit board. The diagram of FIG. 9 is provided for context to show attachment to a substrate. The approaches described above may be used with a wide variety of different substrate and package designs including flip chip packages. The package may be attached directly to a board or it may be attached to a socket or wire connector, depending on the implementation. While the bilayer composite material is shown as a single packaged die, the invention is not so limited. The die may be packaged with additional dies. The die may be embedded, or the die may be retained or protected in any of a variety of other ways.

FIG. 10 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are adhered to a metal plate to resist warpage. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus including a metal plate and a substrate having a coefficient of thermal expansion (CTE) lower than the metal plate to carry microelectronic circuits. An adhesive layer between the substrate and the metal plate physically attaches the metal plate to the substrate so that the combined metal plate and substrate have a higher CTE than the substrate alone and more closely matched to the package on which it will be joined or embedded within.

In further embodiments, the substrate is formed of at least one of silicon, glass, germanium, III-IV, silicon-on-insulator, and ceramic. In further embodiments, the substrate is to carry solder and wherein the adhesive layer is bonded to metal and the substrate at a temperature lower than the melting temperature of the solder In further embodiments, the adhesive layer has a silicon preferential portion to bond to the silicon and a metal preferential portion to bond to the metal, the two portions being bonded to each other. In further embodiments, the silicon preferential portion comprises a first layer applied to the substrate and the metal preferential portion comprises a second layer applied to the metal plate and wherein the two layers are pressed together to bond the silicon substrate to the metal plate. In further embodiments, the first layer comprises epoxy, for example a zirconium alkoxide and epoxide functionalized silane sol-gel layer. In further embodiments, the second layer is a terpene phenolic resin.

In further embodiments, the adhesive layer comprises terpene phenols proximate the metal plate, zirconia proximate the silicon substrate, and amine (or similar epoxy cross-linking chemistry) and epoxy between the terpene phenols and the zirconia. In further embodiments, the adhesive layer comprises gradations of terpene phenols proximate and adhered to the metal plate, amines (or similar epoxy cross-linking chemistry) proximate and adhered to the terpene phenols, epoxy proximate and adhered to the amines (or similar epoxy cross-linking chemistry), and zirconia proximate and adhered to the silicon substrate.

In further embodiments, the metal plate comprises copper, the apparatus further comprising a copper diffusion barrier between the metal plate and the adhesive layer.

Some embodiments relate to a method including applying a first adhesive layer to a metal plate and applying a second adhesive layer to a substrate, the substrate to carry solder and metal layers and having a coefficient of thermal expansion (CTE) lower than the metal plate. The first adhesive layer is pressed to the second adhesive layer to attach the substrate to the metal plate at temperature lower than a melting point of the solder and the metal layers so that the combined metal plate and substrate have a higher CTE than the substrate alone.

In further embodiments, applying the first adhesive layer comprises depositing a metal preferential adhesive layer on the metal plate. In further embodiments, applying the second adhesive layer comprises spin coating a silicon preferential adhesive on the substrate. In further embodiments, pressing comprises pressure bonding. In further embodiments, a metal diffusion barrier is applied to the metal plate before applying the first adhesive layer. In further embodiments, the metal plate is surface treated before applying the second adhesive layer.

Some embodiments relate to an apparatus that include a communications chip, a mass memory, and a processor. The processor is formed on a packaged die, having a metal plate, a substrate having a coefficient of thermal expansion (CTE) lower than the metal plate to carry microelectronic circuits, and an adhesive layer between the substrate and the metal plate to physically attach the metal plate to the substrate so that the combined metal plate and substrate have a higher CTE than the substrate alone. In further embodiments, the packaged die further comprises a cooler directly attached to the metal plate. In further embodiments, the substrate comprises silicon with semiconductors and metal layers formed thereon.

What is claimed is:

1. An apparatus comprising:
   a metal plate;
   a semiconductor die configured to carry microelectronic circuits and connectors formed on a back end of substrate, the substrate having a linear coefficient of thermal expansion (CTE) lower than the metal plate; and
   an adhesive layer on the front end of the substrate opposite the back end between the substrate and the metal plate to physically attach and mechanically couple the metal plate to the substrate so that the combined metal plate and substrate form a composite that has a higher CTE than the substrate alone, the adhesive layer having a first sub-layer proximate the substrate and a second sub-layer proximate the metal, the first and second sub-layers being gradated structures.

2. The apparatus of claim 1, wherein the substrate is formed of at least one of silicon, glass, germanium, III-IV, silicon-on-insulator, and ceramic.

3. The apparatus of claim 1, where in the substrate is configured to carry solder and wherein the adhesive layer is bonded to metal and the substrate at a temperature lower than the melting temperature of the solder.

4. The apparatus of claim 1, wherein the first sub-layer of the adhesive layer includes a silicon preferential portion to bond to the substrate and the second sub-layer of the adhesive layer has a metal preferential portion to bond to the metal, the two portions being bonded to each other.

5. The apparatus of claim 4, wherein the silicon preferential portion is applied to the substrate and the metal preferential portion is applied to the metal plate and where in the two portions are pressed together to bond the silicon substrate to the metal plate.

6. The apparatus of claim 5, wherein the first sub-layer comprises epoxy.

7. The apparatus of claim 6, wherein the first sub-layer comprises a zirconium alkoxide with epoxy functionalized silane to form a sol-gel network.

8. The apparatus of claim 1, wherein the metal plate has a thickness that is twice the thickness of the semiconductor die.

9. The apparatus of claim 1, wherein the adhesive layer comprises terpene phenols proximate the metal plate, zirconia proximate the silicon substrate, and epoxy between the terpene phenols and the zirconia.

10. The apparatus of claim 4, wherein the adhesive layer comprises gradations of terpene phenols proximate and adhered to the metal plate, amines proximate and adhered to the terpene phenols, epoxy proximate and adhered to the amines, and zirconia proximate and adhered to the silicon substrate.

11. The apparatus of claim 1, wherein the metal plate comprises copper, the apparatus further comprising a copper diffusion barrier between the metal plate and the adhesive layer.

12. An apparatus comprising:
   a communications chip;
   a mass memory; and
   a processor formed on a packaged die, the packaged die having a metal plate, a semiconductor die configured to carry microelectronic circuits and connectors formed on a back end of a substrate having a linear coefficient of thermal expansion (CTE) lower than the metal plate, and an adhesive layer on the front end of the substrate opposite the back end between the substrate and the metal plate to physically attach and mechanically couple the metal plate to the substrate so that the combined metal plate and substrate form a composite that has a higher CTE than the substrate alone, the adhesive layer having a first sub-layer proximate the substrate with a higher amount of zirconia than a second sub-layer proximate the metal that has more epoxy than the first sub-layer, the first and second sub-layers being gradated structures.

13. The method of claim 12, wherein applying the first adhesive layer comprises depositing a metal preferential adhesive layer on the metal plate.

14. The method of claim 12, wherein applying the second adhesive layer comprises spin coating a silicon preferential adhesive on the substrate.

15. The method of claim 12, wherein pressing comprises pressure bonding.

16. The method of claim 12, further comprising applying a metal diffusion barrier to the metal plate before applying the first adhesive layer.

17. The method of claim 12, further comprising surface treating the metal plate before applying the second adhesive layer.

18. An apparatus comprising:
a communications chip;
a mass memory; and
a processor formed on a packaged die, the packaged die having a metal plate, a semiconductor die comprising microelectronic circuits and connectors formed on a back end of a substrate, the substrate having a linear coefficient of thermal expansion (CTE) lower than the metal plate, and an adhesive layer on the front end of the substrate opposite the back end between the substrate and the metal plate to physically attach and mechanically couple the metal plate to the substrate so that the combined metal plate and substrate form a composite that has a higher CTE than the substrate alone, the adhesive layer having a first sub-layer proximate the substrate with a higher layer of zirconia than a second sub-layer proximate the metal that has more epoxy than the first sub-layer, the first and second sub-layers being gradated structures.

19. The apparatus of claim 18, the packaged die further comprising a cooler directly attached to the metal plate.

20. The apparatus of claim 18, wherein substrate comprises silicon with semiconductors and metal layers formed thereon.

* * * * *

UNITED STATES PATENT AND TRADEMARK OFFICE
CERTIFICATE OF CORRECTION

PATENT NO.          : 9,520,378 B2                          Page 1 of 1
APPLICATION NO.     : 13/725356
DATED               : December 13, 2016
INVENTOR(S)         : Aleksov et al.

It is certified that error appears in the above-identified patent and that said Letters Patent is hereby corrected as shown below:

In the Specification

In Column 12, at Line 17, delete "where in" and insert --wherein--.

In Column 12, at Line 29, delete "where in" and insert --wherein--.

In Column 14, at Line 19, after "wherein", insert --the--.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*